United States Patent [19]

Landgrebe et al.

[11] Patent Number: 5,756,257

[45] Date of Patent: May 26, 1998

[54] COLOR PROOFING ARTICLE INCORPORATING NOVEL ANTIHALATION DYE

[75] Inventors: Kevin D. Landgrebe, Woodbury; Alice S. Mendelsohn, St. Paul, both of Minn.

[73] Assignee: Imation Corp., Oakdale, Minn.

[21] Appl. No.: 601,625

[22] Filed: Feb. 14, 1996

[51] Int. Cl.[6] .................... G03C 1/83; G03C 1/91; G03C 1/815

[52] U.S. Cl. .................... 430/273.1; 430/259; 430/293; 430/358; 430/512; 430/517; 430/522; 430/931

[58] Field of Search .................... 430/259, 273.1, 430/293, 358, 512, 517, 522, 931

[56] References Cited

U.S. PATENT DOCUMENTS

| | | | |
|---|---|---|---|
| 3,671,236 | 6/1972 | Beusekom | 430/143 |
| 4,020,043 | 4/1977 | Siefkin | 260/46.5 |
| 4,232,108 | 11/1980 | Dessauer | 430/259 |
| 4,243,783 | 1/1981 | Koshar | 526/225 |
| 4,260,673 | 4/1981 | Krech | 430/143 |
| 4,853,316 | 8/1989 | Sanders | 430/272.1 |
| 4,927,732 | 5/1990 | Merrem et al. | 430/191 |
| 5,198,323 | 3/1993 | Kitao et al. | 430/191 |
| 5,218,136 | 6/1993 | Yamamoto et al. | 558/403 |
| 5,248,583 | 9/1993 | Lundquist et al. | 430/263 |
| 5,318,939 | 6/1994 | Laver et al. | 503/209 |
| 5,354,644 | 10/1994 | Yamamoto et al. | 430/270.1 |

*Primary Examiner*—Bernard P. Codd
*Attorney, Agent, or Firm*—Gregory Evearitt; Arlene K. Musser

[57] ABSTRACT

The present invention provides a photosensitive color proofing article incorporating an antihalation effective amount of one or more antihalation dyes of the general formula (I) shown below:

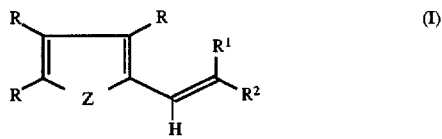

wherein: Z is an oxygen atom, NH, or NR; R is an alkyl group of 1 to 12 carbon atoms or a hydrogen atom; $R^1$ represents a perfluoroalkylsulfonyl group of 1 to 12 carbon atoms or an arylsulfonyl group; and $R^2$ represents a perfluoroalkylsulfonyl group of from 1 to 12 carbon atoms; an arylsulfonyl group; or a cyano group. The antihalation dyes of formula (I) absorb radiation within the wavelength range of from about 325 to 700 nm and preferably, from about 325 to 450 nm.

15 Claims, No Drawings

COLOR PROOFING ARTICLE INCORPORATING NOVEL ANTIHALATION DYE

FIELD OF THE INVENTION

This invention relates to color proofing articles and in particular, it relates to color proofing articles incorporating an antihalation dye therein.

BACKGROUND

In printing pictorial matter, whether by lithography, letterpress, or gravure, the halftone process is used, wherein the actual printing process is composed of thousands of minute dots per square inch of a single color ink of varied dot size or ink density. What the naked eye sees as shading in half-tone prints is actually a controlled variation in size of dots relative to the unprinted areas between the dots or a controlled variation in the ink density of the dots. In black and white pictorial matter the dots are printed in black ink only. Full color reproductions, however, are necessarily printed in each of three colors, yellow, magenta, and cyan (known as "three color process") or in these same colors with the addition of black ("four color process"). For each color a separate printing plate is made. In order to make the three or four printing plates, the original color picture or photograph is "separated" photographically or by laser scanner, with the use of filters, masks, etc., into a set of three or four half-tone negatives or positive transparencies, each representing one of the colors, and containing, dot-for-dot, the amount of that color that must be printed in order for composite three or four printed colors to produce the desired total color print.

The preparation of the color-separation negative or positive films from color transparencies is an art and requires considerable skill in handling the many variables to produce a desired result. Often trial and error are involved, requiring correction or replacement of one or more of the negatives or positives. Unless some reliable system is available to "proof" the color-separated films, the printing press must be set up and copy printed just to secure preliminary proofs. This is time-consuming and expensive.

An example of a positive pre-press proofing system is disclosed in U.S. Pat. No. 4,260,673. The color proofing sheets consist of a carrier sheet having a smooth release surface; a color coating of a diazo oxide and a pigmented-resin compound in clinging engagement with, but not adhesively bonded to, the release surface of the carrier sheet; a binder layer containing a mixture or reaction product of a resin and diazo oxide bonded to the surface of the color coating; the binder layer being free of color pigment; and the color coating and the binder layer being solubilizable in a solvent developing medium upon exposure to actinic radiation, but not solubilizable in the developing medium prior to exposure to actinic radiation; and a clear barrier layer firmly attached to the binder layer, the barrier layer being insoluble in said solvent development medium.

In order to obtain a multi-colored color proofing sheet on one substrate, the barrier layer of a first presensitized sheet of the aforementioned construction is bonded to a substrate and the carrier sheet removed. The substrate with the presensitized proofing sheet bonded thereto is then exposed to actinic radiation through a color separation positive corresponding to the pigment of the color coating. The exposed diazo oxide and resin mixture in the binder layer and the color coating are rendered soluble to a solvent developing medium to create a latent image.

The latent image may then be developed with a solvent developing medium, e.g., an aqueous alkaline medium, preferably sodium hydroxide solution, whereby the exposed diazo oxide and resin mixture in the binder layer and associated color coating are removed leaving the unexposed diazo oxide and resin. By this removal of the exposed binder layer, the pigment normally associated with causing background discoloration that would have remained bonded to the clear barrier layer is removed.

The aforementioned process is repeated in sequence and in register so that the composite proof contains colored layers representing the yellow, magenta, cyan, and black contributions of the original subject matter.

A modified positive-acting pre-press proofing system is disclosed in European Patent Specification No. 0115899A. This proofing system may be utilized in a similar manner to that disclosed in U.S. Pat. No. 4,260,673 but the photosensitive proofing sheets normally contain three layers and do not require the presence of a barrier layer. In particular, the positive-acting color proofing sheet comprises a strippable carrier layer optionally having a release coating on one face thereof upon which is coated a first layer of a base-soluble organic polymeric binder layer having a diazo oxide compound or diazo oxide pendant group on the polymer binder present as at least 15 percent by weight of the binder and sufficient colorant to provide a transmission optical density of at least 1.0, and a thermal adhesive second layer comprising a thermally softenable polymeric adhesive layer, the first layer having at least a substantially polar solvent system with less than 20 percent by volume of all solvents of a non-polar solvent, and the second layer having at least a substantially non-polar solvent system with less than 20 percent by volume of all solvents of a polar solvent.

U.S. Pat. No. 3,649,268 discloses an alternative color proofing system. In this process an element having a removable support and a photohardenable layer is laminated to a suitable receptor, imagewise exposed through a positive transparency of the original through the support to actinic radiation that selectively raises the stick temperature of those areas receiving the radiation. The support is stripped from the layer and the outer surface of the layer treated (e.g., dusted) with a colorant material that adheres only to the underexposed areas of the layer to read out the image. By repeating the laminating, exposing with separate color separation records, stripping and treating steps in sequence using different colors, a multicolor image can be obtained.

U.S. Pat. Nos. 4,247,619; 4,489,153 and 4,489,154 disclose a peel-apart color proofing system. Such a process for preparing a positive overlay involves the steps of: a) exposing through a separation positive image a peel-apart photosensitive element containing in order, from top to bottom, (1) a strippable cover sheet consisting of a polymeric film that is transparent to actinic radiation, (2) a photoadherent layer containing a colorant and comprising a photohardenable material with ethylenically unsaturated or benzophenone type groups, (3) a nonphotosensitive organic contiguous layer, and (4) a sheet support, wherein after exposure to actinic radiation, the peel force required to remove the cover sheet (1) with the exposed photoadherent layer (2) thereon from the contiguous layer (3) is at least four times the peel force required to remove the cover sheet (1) from an exposed photoadherent layer (2); b) peeling apart the exposed photosensitive element to form two elements: (i) a cover sheet bearing on its surface colored exposed image areas, and (ii) a sheet support bearing the contiguous layer having on its surface complementary colored unexposed image areas; c) adhering element (ii) to a transparent receptor; d) removing the transparent receptor and the colored unexposed image areas adhered thereto; e) repeating steps (a) to (d) at least one time; and f) overlaying the images in register.

The process for preparing a positive overlay as described is a dry process, in which liquids need not be used. The photoadherent layer, which is the sole photosensitive layer of the element, is one whose adhesive relationship between the cover sheet and the contiguous layer is altered by exposure to actinic radiation, so that after exposure the exposed areas of the photoadherent layer adhere more strongly to the cover sheet than to the contiguous layer and are removed with the cover sheet while the unexposed areas of the photoadherent layer adhere more strongly to the tacky contiguous layer than to the cover sheet.

In a modified process the photoadherent layer does not contain colorant and the contiguous layer is receptive to color toner which is applied after peeling apart the element.

An example of a negative pre-press proofing system is disclosed in U.S. Pat. No. 3,671,236. The proofing sheets consist of a carrier sheet provided with a release surface, which may either be a smooth surface of the carrier itself, or a surface coating thereon. Overlying the surface and in intimate clinging engagement therewith, but not adhesively bonded thereto, is a color coating formed, for example, of a pigmented organophilic water-insoluble solvent-softenable resinous polymer. Coated over and in contact with the color coating is a light-sensitive diazo resin layer. The color coating and light-sensitive layers are intimately associated and adherently bonded together (and in certain constructions can actually be combined in a single layer). The light-sensitive layer is rendered insoluble on exposure. A solution that softens and/or partially dissolves the color coating is thereafter used to remove the unexposed areas.

Overlying the light-sensitive layer is a continuous solvent-resistant resinous protective film or layer to the exposed surface of which is applied a very thin layer of adhesive, e.g., pressure-sensitive adhesive. A protective release liner can be used to protect the outer pressure-sensitive surface of the adhesive from contamination by dirt or grease, and to prevent adhesive to an adjacent sheet in a pile.

In use, the protective liner is first stripped from the adhesive surface and the entire structure is laminated, for example, by rolling, onto a substrate (e.g., white paper). Thereafter, the carrier sheet is stripped from the structure, since the bond to the paper and the adhesion between the several layers is greater than the non-adhesive clinging engagement between the carrier sheet and the color coating. Following the removal of the carrier, the remaining structure that is now bonded to the substrate is exposed to light through the appropriate color-separation negative corresponding to the color of the coating. In the light struck areas, the light passes through the color coating (which is transparent thereto) and exposes and insolubilizes the light-sensitive material. A firm bond between the light-reacted material and the under- and over-lapping coatings occurs. The non-exposed areas remain light-sensitive.

Thereafter, the sheet is processed with processing solvent (e.g., aqueous alcohol) selected with respect to the particular material of which the layer is composed (and which contains a solvent for the unexposed diazo) to develop the image. The color coating and the sensitizer in the non-light struck areas are removed, leaving the colored image anchored to the underlying layer by the light-reacted diazo in exposed areas. The protective layer serves as a barrier that protects the substrate (and adhesive) from solutions used during the processing.

Following the above-described photomechanical production of the first color image on the substrate, for example cyan, similar sheets but containing yellow, magenta, and black color coatings are successively applied and the images produced over the structure to yield a four-color proof.

Improvements on this negative pre-press proofing system are disclosed in U.S. Pat. Nos. 4,650,738; 4,751,166; 4,808,508; 4,929,532; and 5,008,174. EP Application Nos. 365,356 and 365,357 describe improvements on the construction by eliminating the need for a barrier layer between the diazo-based photoactive layer and the adhesive. The developers used in these systems are aqueous alkali solutions containing greater than 3% surfactant. U.S. Pat. No. 4,596,757 discloses a further improvement utilizing a photomonomer system in place of the diazonium binders. U.S. Pat. No. 5,248,583 improves upon the above-mentioned constructions by utilizing a photoactive color layer containing a photo-oligomer as the photopolymerizable component and a photopolymerizable barrier layer to provide a proofing element that can be developed in a low solids aqueous developer having a pH of 10.2.

In imaging processes, such as those described above, where a sequence of imaged layers is built up, absorption or reflection of actinic radiation by previously imaged layers can produce detrimental effects in the quality and fidelity of reproduction of images, particularly dots, upon imaging exposure. The prior art describes the use of (a) an antihalation layer used below a photohardenable layer or (b) compounds (frequently dyes) used within the photohardenable layer that absorb actinic radiation to prevent halation effects. In spectral regions where a photoinitiator strongly absorbs actinic radiation, the photoinitiator itself functions as an antihalation agent. In spectral regions where a photoinitiator moderately or weakly absorbs, e.g., in the spectral region overlapping near ultraviolet and visible blue, an additional ultraviolet-absorbing antihalation agent is needed.

U.S. Pat. No. 3,854,950 discloses a photosensitive element suitable for use in a system that has a support and at least one photohardenable layer containing an intimate mixture of (a) a photohardenable material, (b) a photoinitiator activatable by actinic radiation that is substantially in the near-UV wavelength spectral region (i.e. about 325 to 425 nm), and (c) a sufficient amount of an ultraviolet radiation-absorbing material to reduce the actinic ultraviolet radiation transmitted by the photohardenable layer by more than about 50 percent, the photohardenable layer visually transmitting or reflecting virtually white light. The UV-absorbing material must not tint the composition, and if the composition is discolored due to other components, the ultraviolet radiation absorbing material must brighten the composition so as to render it clear and colorless, whereby the composition will visually transmit or reflect virtually white light.

The commercially-available color proofing systems employing the lamination techniques described above tend to be sensitive to actinic radiation towards the ultraviolet and, in particular, within the general wavelength band 325 to 450 nm. These materials are normally exposed to a "photopolymer" source primarily emitting from 320 to 390 nm, but also in the visible region of the spectrum up to 450 nm. Other exposure sources that may be employed include "diazo" sources that emit primarily from 385 to 435 nm and that also have an emission at about 560 nm and combination photopolymer-diazo sources having primary emissions within the range 325 to 380 nm and also at about 425 nm.

Dyes suppressing halation need to be matched to the light source and the absorbance of the photosensitive layer. It is desirable to provide color proofing sheets that achieve halation suppression in the ultraviolet and near visible spectrum as indicated by increased exposure latitude.

U.S. Pat. No. 5,318,939 discloses vinyl aryl (including vinyl thiophene, vinyl pyrrole and vinyl furan) compounds substituted in the terminal olefinic position with various electron-withdrawing groups (including independently sulfonyl and cyano) for use as UV absorbers in pressure-sensitive or heat-sensitive recording. The compounds, however, are placed between the light source and a color former to be protected from UV light, whereas the compounds of the present invention are placed in the same layer that comprises the photosensitive element, or are situated so that the photosensitive element-containing layer is placed between the light source and the antihalation layer.

U.S. Pat. No. 5,198,323 discloses vinyl aryl (including vinyl thiophene, vinyl pyrrole and vinyl furan) compounds substituted in the terminal olefinic position with cyano or carboxylic ester groups, and European Patent Application No. 323,631 discloses similarly substituted styryl compounds, both for use in semiconductor manufacture. U.S. Pat. No. 5,218,136 discloses aminostyryl compounds substituted at the terminal olefinic positions with electron-withdrawing groups useful for preparing photoresist compositions. U.S. Pat. No. 4,927,732 discloses dicyanoviny-laminostyryl antihalation dyes for use in positive-acting photosensitive recording materials.

What are needed in the industry are improved antihalation dyes for photosensitive color proofing articles. It was against this background that the present invention was developed.

SUMMARY OF THE INVENTION

According to the present invention there is provided a photosensitive color proofing article incorporating an antihalation effective amount of one or more antihalation dyes of the general formula (I) shown below:

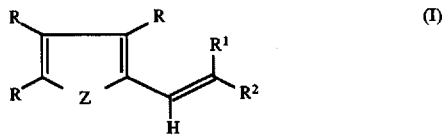

wherein: Z is an oxygen atom, NH, or NR; R is an alkyl group of 1 to 12 carbon atoms or a hydrogen atom; $R^1$ represents a perfluoroalkylsulfonyl group of 1 to 12 carbon atoms or an arylsulfonyl group; and $R^2$ represents a perfluoroalkylsulfonyl group of from 1 to 12 carbon atoms; an arylsulfonyl group; or a cyano group. The antihalation dyes of formula (I) absorb radiation within the wavelength range of from about 325 to 700 nm and preferably, from about 325 to 450 nm.

The photosensitive color proofing article of the present invention comprises a photosensitive color layer and a suitable support, wherein at least one antihalation dye of formula (I) can be present in or between at least one of the photosensitive color layer and the suitable support. The photosensitive color layer may be in direct contact with the support, or in many constructions intermediate layers (e.g., photopolymerizable barrier layers, thermal adhesive layers, etc.) may be present. Preferably, the antihalation dye is present in either an intermediate layer or the substrate. Optionally, additional layers (e.g., carrier layers, release layers, oxygen barrier layers, etc.) may be incorporated into the the construction as desired.

In a preferred embodiment, the photosensitive color proofing article of the present invention comprises, in order, the following: (a) a carrier layer; (b) a release layer which also acts as an oxygen barrier layer; (c) a photosensitive color layer; (d) a photopolymerizable barrier layer; (e) a thermal adhesive layer; and (f) a suitable substrate, wherein at least one antihalation dye of formula (I) can be present in the photosensitive color layer, the photopolymerizable barrier layer, the thermal adhesive layer, or the suitable substrate. Preferably, the antihalation dye is present in the photopolymerizable barrier layer, the thermal adhesive layer, or the suitable substrate. More preferably, the antihalation dye is present in the thermal adhesive layer.

As is well understood in this area, substitution is not only tolerated, but is often advisable. As a means of simplifying the discussion and recitation of certain terminology used throughout this application, the terms "group" and "moiety" are used to differentiate between chemical species that allow for substitution or which may be substituted and those which do not so allow or may not be so substituted. Thus, when the term "group" is used to describe a chemical substituent, the described chemical material includes the basic group and that group with conventional substitution. Where the term "moiety" is used to describe a chemical compound or substituent, only an unsubstituted chemical material is intended to be included. For example, the phrase "alkyl group" is intended to include not only pure open-chain and cyclic saturated hydrocarbon alkyl substituents, such as methyl, ethyl, propyl, t-butyl, cyclohexyl, adamantyl, octadecyl, and the like, but also alkyl substituents bearing further substituents known in the art, such as hydroxyl, alkoxy, vinyl, phenyl, halogen atoms (F, Cl, Br, and I), cyano, nitro, amino, carboxyl, etc. On the other hand, the phrase "alkyl moiety" is limited to the inclusion of only pure open-chain and cyclic saturated hydrocarbon alkyl substituents, such as methyl, ethyl, propyl, t-butyl, cyclohexyl, adamantyl, octadecyl, and the like.

Other aspects, advantages, and benefits of the present invention are apparent from the detailed description, the examples, and the claims.

DETAILED DESCRIPTION OF THE INVENTION

The present invention provides photosensitive color proofing articles containing halation suppression compounds of the formula (I) disclosed earlier herein. Antihalation dyes of the formula (I) can be prepared by conventional methods as described in the art. See, for example, U.S. Pat. Nos. 4,018,810; 5,318,939 and 5,198,323. A particularly useful method of preparing these antihalation dyes is shown in the following Scheme:

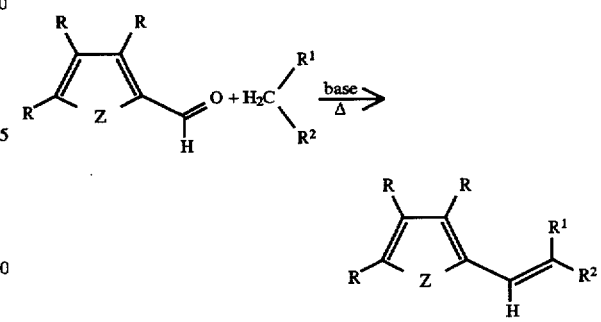

wherein Z, R, $R^1$ and $R^2$ are as defined previously for formula (I).

The reaction in the above scheme is a Knoevenagel condensation. The wide scope of reaction conditions and components is discussed, for example, in the book *Advanced Organic Chemistry: Reactions Mechanisms, and Structure*, Third Ed., J. March, pp. 836–837, Wiley-Interscience (1985).

The photosensitive color proofing article of the present invention comprises a photosensitive color layer and a suitable support, wherein at least one antihalation dye of formula (I) can be present in or between at least one of the photosensitive color layer and the suitable support. The photosensitive color layer may be in direct contact with the support, or in many constructions intermediate layers (e.g., photopolymerizable barrier layers, thermal adhesive layers, etc.) may be present. Preferably, the antihalation dye is present in either an intermediate layer or the substrate. Optionally, additional layers (e.g., carrier layers, release layers, oxygen barrier layers, etc.) may be incorporated into the the construction as desired.

In a preferred embodiment, the present invention provides photosensitive color proofing articles containing halation suppression compounds of the formula (I) disclosed earlier herein. The inventive photosensitive color proofing article comprises in order: (a) a carrier layer; (b) a release layer which also functions as an oxygen barrier layer; (c) a photosensitive color layer; (d) a photopolymerizable barrier layer; (e) a thermal adhesive layer; and (f) a suitable support.

The carrier must have a release surface whose function is to serve as a parting layer between the carrier sheet and the release/oxygen barrier layer. In a preferred embodiment, the carrier is composed of a dimensionally and chemically stable base material. In particular, the carrier is polyethylene terephthalate (PET) having a thickness of 1 to 10 mils (0.025 to 0.25 mm) and more preferably, a thickness of 2 to 3 mils (0.05 to 0.076 mm). The carrier must be capable of holding the image during and after development, which may require some treatment of the polyester surface. Adhesion promotion can be achieved through chemically treated films, such as Melinex™ 505 (available from ICI Americas Inc., Wilmington, Del.) and/or corona discharge flame treatment, or irradiation (as disclosed in U.S. Pat. No. 4,879,176) to promote adhesion of the image without interference in development of the nonimaged areas.

The release layer also functions as an oxygen barrier. This oxygen barrier can function as both a barrier for oxygen and as a release layer. The oxygen barrier/release layer releases from the carrier and clings to the photosensitive color layer after lamination to a receiver and subsequent removal of the carrier. The release/oxygen barrier layer can be any known to those of ordinary skill in the art. Non-limiting examples include polyvinyl alcohol (PVA) and a copolymer of acrylonitrile and acrylic acid. The release properties of the layer are controlled by the incorporation of a water soluble surfactant. Preferred surfactants non-exclusively include alkylarylpolyether alcohols, glycerin and ethoxylated castor oil. In the preferred embodiment, the surfactant is present in the release layer in the amount of 0.1–5% by weight of solids in the layer, more preferably 0.5–3%. Other ingredients may be added such as mold inhibitors, antihalation dyes, filter dyes, solvents, wetting agents, etc.

Adjacent to the release layer is coated the photosensitive color layer. The photosensitive color layer typically comprises a photopolymerizable oligomer, colorant, initiator system, binders and other optional components such as wetting agents, surfactants, coating rheology modifiers, optical brighteners, plasticizers, residual solvents, fillers, etc. The photosensitive color layer is coated onto the release/oxygen barrier using a mixture of solvents which gives rise to the best coating quality and solution stability. Representative solvents include ketones, alkyl ethers or acetates of propylene glycol, alkyl ethers or acetates of ethylene glycol, dioxalane, butyrolactone, and alcohols.

The photopolymerizable oligomer comprises a multifunctional acrylate whose function is to form a high molecular weight polymer upon initiation by radiation (e.g., ultraviolet radiation or visible light) generated radicals. The molecular weight of the acrylated oligomer influences several performance characteristics of the final coated films such as the tack of the coated film, the strength of the developer necessary to develop the image, and the quality of the image attained. If the film imparts too much tack, then it is difficult to manufacture the material in a production coating process without disruption of the film, in turn, giving rise to poor coating quality. The strength of the developer required to develop the image is generally directly proportional to the molecular weight of the oligomer and the acid content of the oligomer. Oligomers with lower molecular weights and high acid content are easier to develop and therefore do not need very aggressive developers. However, too much acid content or too high a molecular weight can cause destabilization of the pigment dispersions when acidic binders are used to disperse the pigments. Some examples of oligomers include multiacrylated urethane oligomers, as described in U.S. Pat. No. 4,304,923. The photo-polymerizable oligomer is present in the composition in the amount of 45–70% by weight and has a mean molecular weight range of 2500 to 5500.

In the preferred embodiment, the photoinitiator(s) used must not generate a visible color change in the image after exposure. Examples of photoinitiators include, but are not limited to, triazines, acetophenones, benzophenones, and thioxanthones. The preferred photoinitiators include Irgacure™ 907 (2-methyl-1-(4-(methylthio) phenyl)-2-(4-morpholinyl)-1-propanone) and Irgacure™ 369 (both available from Ciba Geigy Corp., Ardsley, N.Y.), Quantacure™ ITX (isopropylthioxanthone, available from Ward Blenkinsop & Co., Ltd., Widnes Chehire, U.K.) and triazines tethered to alkylarylpolyether alcohols and are present in the composition in the amount of 1.0–15% by weight. The optimum amount of initiator will be dependent upon the oligomer type used and the light filtering effect of the pigment used.

Pigments or dyes may be used as colorants in the photosensitive color layer; however, pigments are preferred since they provide more light-stable colored images. The pigments are generally introduced into the photosensitive formulation in the form of a millbase comprising the pigment dispersed with a binder and suspended into a solvent or mixture of solvents. Many different pigments are available and are well known in the art. The pigment type and color are chosen so that the coated colored element is matched to a preset color target or specification set by the industry. The type of dispersing resin and the pigment-to-resin composition ratio chosen are dependent upon the pigment type, surface treatment on the pigment; dispersing solvent and milling process. Some examples of resins suitable for generating millbases which are compatible with the aforementioned photopolymerizable oligomers include: polyvinyl acetate/crotonic acid copolymers, styrene maleic anhydride half esters resins, acrylic and methacrylic polymers and copolymers, polyvinyl acetals, polyvinyl acetals modified with anhydrides and amines, hydroxy alkyl cellulose resins and styrene acrylic resins. The primary composition of the dispersing resin is an acidic resin; however, some non-acidic resins may be present. In some combinations, a dispersing agent may be necessary to achieve optimum dispersion quality. Some examples of dispersing agents nonexclusively include: polyester/polyamine copolymers, DISPERSE-AYD™ dispersants (available from Synres Chemical Corp., Daniel Products Co. Division, Jersey City, N.J.), PKE 1370 polyester resin (available from Biddle Sawyer Corp., New York, N.Y.) alkylarylpolyether alcohols, and acrylic resins. Other components may also be included in the millbase, such as surfactants to improve solution stability, fluorescent materials, optical brighteners, UV absorbers, fillers, etc. The preferred composition of the millbase comprises 30–71% by weight pigment, 15–30% by weight acidic resin, 0–25% non-acidic resin, and 0–20%, more preferably 0–10%, dispersing agents.

Additional binders may also be included in the photosensitive color formulation to balance developability and tack. Some non-exclusive examples of additional binders which are compatible with the aforementioned photopolymerizable oligomers and millbases include: polyvinyl acetate/crotonic acid copolymers, styrene maleic anhydride half ester resins, acrylic and methacrylic polymers and copolymers, polyvinyl acetals, polyvinyl acetals modified with anhydrides and amines, and styrene acrylic resins. In the preferred composition of the photosensitive color layer, the pigment is present in the amount of 5–20% by weight, the acidic resin in the amount of 10–20% by weight, the non-acidic resin in the amount of 1–5% by weight, initiator in the amount of 1 to 15% by weight, and photopolymerizable oligomer in the amount of 45–70% by weight.

Coated adjacent to the photosensitive color layer is the photopolymerizable barrier layer. The photopolymerizable barrier layer is present to prevent interaction between the color layer and adhesive and to improve developability of the non-image areas. The composition of the photopolymerizable barrier layer comprises an ethylenically unsaturated compound which can form a higher molecular weight polymer upon photochemical radical initiation, an acidic binder and a photoinitiator. Preferred examples of ethylenically unsaturated compounds include, but are not limited to, acrylated epoxy oligomers, acrylated urethane oligomers as described in U.S. Pat. No. 4,304,923, Echo Resin™ TAE (#310) (triacrylated aromatic epoxide, available from Echo Resins & Laboratory, Versailles, Mo.) and Dynacoll™ A6083 (acrylated copolyester available from Hüls America Inc., Piscataway, N.J.) and are present in the composition in the amount of 45–65% by weight. Preferred binders include, but are not limited to, polyvinyl acetate/crotonic acid copolymers, styrene maleic anhydride half ester resins, acrylic and methacrylic polymers and copolymers, acidified polyvinyl acetals, and styrene acrylic resins and are present in the composition in the amount of 30–50% by weight. Preferred photoinitiators include, but are not limited to, Irgacure™ 907, Quantacure™ ITX (2-isopropylthioxathone) and triazines tethered to alkylarylpolyether alcohols and are present in the composition in the amount of 1–10% by weight. The thickness is generally between 0.15 and 2.0 g/m², preferably between 0.2 and 1.0 g/m² dry weight, of the entire layer. This is about 0.15 to 2.0 micrometers in thickness.

Coated adjacent to the photopolymerizable barrier is the thermal adhesive layer. The thermal adhesive layer provides a means of laminating the color proofing element to a substrate under heat and pressure. The solvent used for this coating preferably does not attack or interact with the adjacent layer. Examples of solvents include alcohols, water and hydrocarbon solvents. Because hydrocarbon solvents like heptane are prone to irregular coating patterns, production is very difficult; more polar solvents such as water and alcohols are preferred. Some examples of thermal resins which may be used include: vinyl acetate polymers and copolymers; acrylic and methacrylic polymers; copolymers and terpolymers; polyvinylacetals and acrylamide copolymers and terpolymers. Vinyl acetate polymers have been found to be very sensitive to moisture and can cause blocking of the coated materials in shipment and storage if the vinyl acetate component of the adhesive is present at amounts greater than 20%. The preferred thermoplastics resins include: copolymers of vinyl acetate which contain less than 20% vinyl acetate, Wallpol™ 40165 (terpolymer of vinyl acetate/methyl methacrylate/butyl acrylate) and Synthemul™ 97–603 (both available from Reichhold Chemical Co. Inc., Research Triangle Park, N.C.), terpolymers of N-(hydroxymethyl) acrylamide/butyl acrylate/methyl methacrylate, and copolymers of alkyl acrylates and alkyl methacrylates. Other additives may be present to aid in coating and performance such as surfactants, coalescence aids, plasticizers, polymethacrylate beads (as described in U.S. Pat. No. 4,885,225), silica, polyethylene waxes, optical brightener, UV absorbers, etc.

The suitable substrate may be any material known to those of ordinary skill in the art such as paper and plastic.

Developer solutions used to develop the image after exposure typically comprise a combination of sodium or potassium carbonate, and sodium or potassium bicarbonate and a surfactant. In the preferred embodiment, the carbonate concentration is in an amount 0.5–2% by weight, the bicarbonate concentration is in the amount 0–1% by weight, and the surfactant concentration is in the amount 0.1–1% by weight of the total developer solution and the balance is water. The preferred surfactants include: Surfynol™ 465 (ethoxylated tetramethyl decynediol) and Surfynol™ GA (acetylenic diols compounded with other non-ionic surfactants and solvents, both available from Air Products and Chemicals, Inc. Allentown, Pa.), Surfactol™ 365 (ethoxylated castor oil, available from CASCHEM, Inc., Bayonne, N.J.) and Triton X-100 (octylphenoxypolyethoxyethanol, available from Union Carbide Chemicals and Plastics Co., Inc., Danbury, Conn.).

Exposure latitude, as defined by GATF Glossary of Graphic Arts Terms, "is the range of exposures that can be used to produce a commercially-acceptable image . . . " For the following examples, exposure latitudes were determined from the minimum exposure where 2% highlight dots are observed and the maximum exposure before which 98% shadows start to plug using a 200 line-per-inch hard dot Microphase target to image the construction. These examples are intended to be illustrative of, but not limiting of, the present invention.

EXAMPLES

All chemicals, unless otherwise noted, were commercially available and were purchased from Aldrich Chemical Co., Inc., Milwaukee, Wis.

Proofing Sheet Preparation

The following procedure was followed for preparing proofing sheets for each of the examples discussed below.

The following oxygen barrier/release layer coating solution was coated and dried to achieve a dry coating weight of 0.8 g/m² onto 2 mil (0.05 mm) polyester film:

| OXYGEN/BARRIER RELEASE SOLUTION | |
|---|---|
| | (Parts by Weight) |
| Airvol ™ 540 Polyvinyl alcohol | 0.38 |
| Airvol ™ 205 Polyvinyl alcohol | 1.1 |
| PVP K-90 (polyvinylpyrrolidone) | 1.0 |
| Surfactol ™ 365 surfactant | 0.08 |
| Kathon ™ CG/ICP Preservative | 0.01 |
| Distilled Water | 97.5 |

Airvol ™ 540 and Airvol ™ 205 are available from Air Products, Allentown, PA
PVP K-90 is available from International Specialty Products, Wayne, NJ
Surfactol ™ 365 is available from CASCHEM, Bayonne, NJ
Kathon ™ CG/ICP is available from Rohm and Haas, Philadelphia, PA The following pigment millbases were prepared for incorporation into the photosensitive color coating solution:

| RED-SHADE MAGENTA MILLBASE COMPOSITION | |
|---|---|
| | (Parts by Weight) |
| Pigment Red 234-0071 Radiant | 8.4 |
| Butvar ™ B-98 | 1.1 |
| Joncryl ® 67 | 4.5 |
| Disperbyk ® 161 | 0.84 |
| Fluorad ™ FC 430 | 0.17 |
| Methyl ethyl ketone | 51.0 |
| Propylene glycol monomethyl ether | 34.0 |

Pigment Red 234-0071 Radiant is available from Sun Chemical Corp., Carlstadt, NJ
Butvar ™ B-98 polyvinyl butyral is available from Monsanto Chemical Co., St. Louis, MO
Joncryl ™ 67 styrene acrylic resin is available from S.C. Johnson & Son, Inc., Racine, WI
Disperbyk ™ 161 is available from Byk-Chemie USA, Wallingford, CT
Fluorad ™ FC 430 fluorinated nonionic surfactant is available from 3M, St. Paul, MN

| BLUE-SHADE MAGENTA MILLBASE COMPOSITION | |
|---|---|
| | (Parts by Weight) |
| Ciba Geigy RT-333D | 6.78 |
| Butvar ™ B-98 | 2.26 |
| Joncryl ™ 67 | 2.26 |
| Disperbyk ® 161 | 0.68 |
| Fluorad ™ FC 430 | 0.02 |
| Methyl ethyl ketone | 52.8 |
| Propylene glycol monomethyl ether | 35.3 |

Ciba Geigy RT-333D is available from Ciba Geigy Corp., Newport, DE

| BLACK MILLBASE COMPOSITION | |
|---|---|
| | (Parts by Weight) |
| Raven 760 | 11.07 |
| Butvar ™ B-98 | 1.98 |
| Joncryl ® 67 | 5.92 |
| Disperbyk ® 161 | 1.0 |
| Fluorad ™ FC 430 | 0.04 |
| Methyl ethyl ketone | 48.0 |
| Propylene glycol monomethyl ether | 32.0 |

Raven 760 is available from Columbian Chemicals Co., Atlanta, GA

The following photosensitive color coating solution was coated and dried to a reflection optical density representative of the color separation for SWOP industry color target onto the previously coated oxygen barrier/release layer:

| PHOTOSENSITIVE COLOR SOLUTION | |
|---|---|
| | (Parts by Weight) |
| Red Shade Magenta Millbase Solution (15% solids) | 17.04 |
| Blue Shade Magenta Millbase Solution (12% solids) | 3.09 |
| Black Millbase Solution (20% solids) | 0.62 |
| Acrylated Urethane Oligomer P-II* | 8.06 |
| Joncryl ® 67 | 1.03 |
| Acidified Butvar ™ B-98 poly(vinyl butyral) resin | 0.53 |
| Triazine Initiator** | 0.26 |
| Methyl ethyl ketone | 50.31 |
| Propylene glycol monomethyl ether | 19.06 |

*Synthesis described in U.S. PAT. NO. 4,304,923
**Triazine Initiator = m-MOST-ol tethered to Igepal CO-520 (see U.S. PAT. NO. 5,298,361)

The following photopolymerizable barrier coating solution was coated and dried to a dry coating weight of 0.65 g/m$^2$ onto the previously coated photosensitive color layer:

| PHOTOSENSITIVE BARRIER SOLUTION | |
|---|---|
| | (Parts by Weight) |
| Echo ™ 310 | 2.89 |
| Joncryl ® 586 | 1.98 |
| Triazine Initiator | 0.13 |
| Methyl ethyl ketone | 93.67 |
| Propylene glycol monomethyl ether | 1.33 |

Echo ™ 310 (acrylated novolac-glycidyl ether) is available from Echo Resins and Laboratory, Versailles, MO
Joncryl ® 586 (styrene acrylic resin), available from S.C. Johnson & Son, Inc., Racine, WI The following thermal adhesive coating solution was coated with a #10 Mayer bar onto the previously coated photopolymerizable barrier layer and then dried at 200° C. for 75 seconds:

| THERMAL ADHESIVE SOLUTION | |
|---|---|
| | (Parts by Weight) |
| Synthemul ® 97-603 latex | 35.4 |
| Antihalation dye | ** |
| Distilled Water | 64.0 |
| Tetronic ™ 701 surfactant | 0.4 |

Synthemul ® 97-603 latex (latex emulsion-methyl methacrylate, butyl methacrylate, N-methylol acrylamide), available from Reichold Chem. Co, Inc., Research Triangle Park, NC Tetronic ™ 701 surfactant is available from BASF Corp., Mount Olive, NJ
**Dyes that are water-soluble can be directly added to the adhesive solution. Non water-soluble dyes were dissolved first in either dichloromethane or ethanol. The appropriate amount of dye solution was then dispersed in the adhesive. The amount of antihalation dye added (typically 0.07 to 2.0 wt. % in the adhesive solution) was adjusted for each dye such that the final absorbance at $L_{max}$ of a typical coating made from the thermal adhesive solution was between 0.2 and 0.4. No dye was added for the preparation of the control sheets in the examples below.

Antihalation Dye Synthesis

The antihalation dyes can be prepared according to well known procedures of synthetic organic chemistry, such as those disclosed in U.S. Pat. Nos. 4,018,810, 5,318,939; and 5,198,323. The following dye intermediates can be purchased from Aldrich Chemical Co., Milwaukee, Wis.: 5-methylfurfural, 5-(hydroxymethyl)furfural, pyrrole-2-carboxaldehyde, phenylsulfonylacetonitrile, ethyl cyanoacetate, 2-cyanoacetamide, and malononitrile. Methanesulfonylacetonitrile can be purchased from Johnson Matthey Catalog Co., Ward Hill, Mass. Trifluoromethanesulfonylacetonitrile can be prepared according to the procedure described in Synthesis, (12), 1991, pp. 1205–1208.

Bis(trifluoromethylsulfonyl)methane can be prepared according to the procedure disclosed in U.S. Pat. No. 3,586,616. Methanesulfonylacetonitrile can be purchased from Lancaster Synthesis, Windham, N.H.

Preparation of Dye IA:

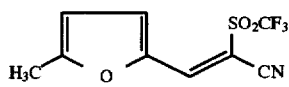

5-Methylfurfural (0.64 g, 5.78 mmoles), trifluoromethanesulfonylacetonitrile (1.0 g, 5.78 mmoles) and 60 ml benzene were combined in a round-bottomed flask at room temperature. With stirring, 1 drop piperidine was added and the mixture was stirred an additional thirty minutes. The solvent was removed in vacuo to produce a viscous liquid, which yielded crystals upon addition of a 1:2 mixture of ethanol and hexane. The crystals were collected and then recrystallized using 1:2 ethanol/hexane. The structure of the compound was confirmed by NMR and exact mass spectrometry. The melting point of the compound was 77°–78° C. The absorption spectrum showed lMax=374.4 nm ($CH_2Cl_2$).

Preparation of Dye IB:

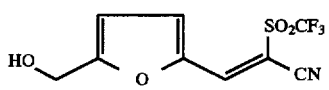

5-(Hydroxymethyl)furfural (0.73 g, 5.78 mmoles), trifluoromethanesulfonylacetonitrile (1.0 g, 5.78 nmoles) and 60 ml benzene were combined in a round-bottomed flask at room temperature. With stirring, 1 drop piperidine was added and the mixture was stirred an additional thirty minutes. The solvent was removed in vacuo to produce a solid. The compound was recrystallized using a 1:2 mixture of ethanol and hexane. The structure of the compound was confirmed by NMR and exact mass spectrometry. The absorption spectrum showed lMax=368 nm ($CH_2Cl_2$).

Preparation of Dye IC:

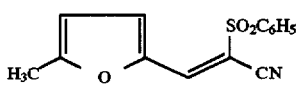

5-Methylfurfural (0.55 g, 5.0 mmoles), phenylsulfonylacetonitrile (0.91 g, 5.0 mmoles) and 50 ml benzene were combined in a round-bottomed flask at room temperature. With stirring, 1 drop piperidine was added and the mixture was stirred an additional ninety minutes. The solvent was removed in vacuo to produce a viscous liquid, which yielded crystals upon addition of a 1:1 mixture of ethanol and hexane. The crystals were collected and then recrystallized using 1:1 ethanol/hexane. The structure of the compound was confirmed by NMR and exact mass spectrometry. The absorption spectrum showed lmax=358.4 nm ($CH_2Cl_2$).

Preparation of Dve ID:

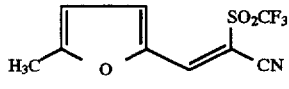

5-Methylfurfural (0.55 g, 5.0 mmuoles), bis(trifluoromethylsulfonyl)methane (1.4 g, 5.0 mmoles) and 50 ml benzene were combined in a round-bottomed flask at room temperature. With stirring, 1 drop piperidine was added and the mixture was stirred an additional twenty-four hours. The solvent was removed in vacuo to produce a iscous liquid, which yielded crystals upon addition of a 1:1 mixture of ethanol and hexane. The crystals were collected and then recrystallized using 1:1 ethanol/hexane. The structure of the compound was confirmed by NMR and exact mass spectrometry. The absorption spectrum showed lmax= 295.6 nm ($CH_2Cl_2$).

Preparation of Dye IE:

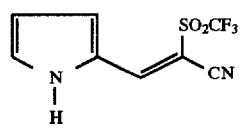

Pyrrole-2-carboxaldehyde (0.55 g, 5.78 mmoles), trifluoromethanesulfonylacetonitrile (1.0 g, 5.78 mmoles) and 60 ml benzene were combined in a round-bottomed flask at room temperature. With stirring, 0.1 ml piperidine was added and the mixture was stirred an additional sixty minutes. The solvent was removed in vacuo to produce a solid, which was immediately recrystallized using 1:1 ethanol/ hexane. (Care was taken to isolate the crystals immediately after their formation, owing to their tendency to turn brown when in contact with the recrystallizing solvent after a few hours). The structure of the compound was confirmed by NMR and exact mass spectrometry. The absorption spectrum showed lMax=375.2 nm ($CH_2Cl_2$).

Preparation of Dye IF (Comparative Example):

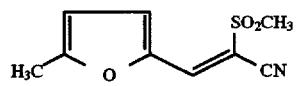

5-Methylfurfural (0.17 g, 1.51 mmoles), methanesulfonylacetonitrile (0.18 g, 1.51 mmoles) and 15 ml benzene were combined in a round-bottomed flask at room temperature. With stirring, 1 drop piperidine was added and the mixture was stirred an additional twenty hours. The solvent was removed in vacuo to produce a solid. The compound was recrystallized using a 1:1 mixture of ethanol and hexane. The structure of the compound was confirmed by NMR and exact mass spectrometry. The absorption spectrum showed lMax=351 nm ($CH_2Cl_2$).

Preparation of Dye IG (Comparative Example):

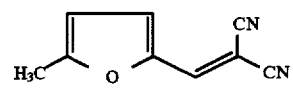

5-Methylfurfural (0.64 g, 5.78 mmoles), malononitrile (0.38 g, 5.78 mmoles) and 60 ml benzene were combined in a round-bottomed flask at room temperature. With stirring, 1 drop piperidine was added and the mixture was stirred an additional thirty minutes. The solvent was removed in vacuo to produce a solid. The compound was recrystallized using a 1:1 mixture of ethanol and hexane. The structure of the compound was confirmed by NMR and exact mass spectrometry. The melting point of the compound was 92°–93° C. The absorption spectrum showed lmax=364 mn ($CH_2Cl_2$).

Preparation of Dye IH (Comparative Example):

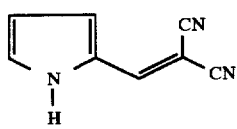

Pyrrole-2-carboxaldehyde (0.48 g, 5.0 mmoles), malononitrile (0.33 g, 5.0 mmoles) and 50 ml benzene were combined in a round-bottomed flask at room temperature. With stirring, 1 drop piperidine was added and the mixture was stirred an additional sixty minutes. The solvent was removed in vacuo to produce a solid, which was immediately recrystallized using 1:1 ethanol/hexane. (Care was taken to isolate the crystals immediately after their formation, owing to their tendency to turn brown when in contact with the recrystallizing solvent after a few hours). The structure of the compound was confirmed by NMR and exact mass spectrometry. The absorption spectrum showed lMax=368.4 nm ($CH_2Cl_2$).

Imaging

A magenta proof was imaged and developed in the usual manner for Matchprint™ as disclosed, for example, in U.S. Pat. No. 5,248,583, using the following developer solution:

| DEVELOPER SOLUTION | |
|---|---|
| | (Parts by Weight) |
| Potassium Carbonate ($K_2CO_3$) | 1.0 |
| Sodium Bicarbonate ($NaHCO_3$) | 1.0 |
| Triton ™ DF-16 surfactant | 0.1 |
| Distilled Water | 97.9 |

Potassium Carbonate and Sodium Bicarbonate are available from Armand Products Co., Columbus, OH
Triton ™ DF-16 is available from Union Carbide Chemicals and Plastics Co., Inc., Danbury, CT Exposure Latitudes Exposure latitudes were determined from the minimum exposure required to produce 2% highlight dots and the maximum exposure before which 98% shadows start to plug as is well known to one of ordinary skill in the art.

Results

The following compounds were incorporated in the proofing sheet construction (by inclusion in the thermal adhesive solution formula). Data are reported for exposure latitude compared with exposure latitude for control sheet (noted in parentheses). The numbers in the last column (D) represent the number of steps improvement in exposure latitude compared with the control (no antihalation dye added). Example compounds IF, IG, and IH are provided as comparative examples.

| Antihalation Dye | | Exposure | D (Latitude (Steps) |
|---|---|---|---|
| IA |  | 4.9 (2.7) | +2.2 |
| IB |  | 3.9 (2.0) | +1.9 |
| IC | 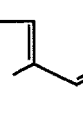 | 3.0 (2.7) | +0.3 |
| ID |  | 2.2 (2.0) | +0.2 |
| IE |  | 6.2 (2.6) | +3.6 |
| IF | 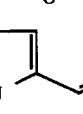 | 2.3 (2.7) | −0.4 |
| IG | 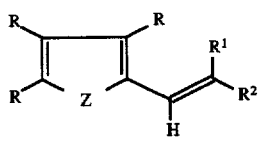 | 4.0 (3.3) | +0.7 |
| IH | | 4.8 (2.6) | +2.2 |

The results show that compounds IA–IE, antihalation dyes of the present invention, all increase exposure latitude. Comparison of the increases in exposure latitude for dyes IA and IE over IG and IH (comparative examples) highlights the great improvement obtained in using the cyanotrifluoromethanesulfonyl compounds of the present invention for antihalation.

Reasonable modifications and variations are possible from the foregoing disclosure without departing from either the spirit or scope of the present invention as defined in the claims.

What is claimed is:

1. A photosensitive color proofing article comprising: a photosensitive color layer and a suitable support; said photosensitive color proofing article comprising an antihalation effective amount of at least one antihalation dye of the general formula:

[structure]

wherein: Z is an oxygen atom, NH, or NR; R is an alkyl group of 1 to 12 carbon atoms or a hydrogen atom; $R^1$ represents an arylsulfonyl group; and $R^2$ represents a perfluoroalkylsulfonyl group of 1 to 12 carbon atom; said at least one antihalation dye being present in or between at least one of said photosensitive color layer and said suitable support.

2. A photosensitive color proofing article comprising: a photosensitive color layer and a suitable support; said photosensitive color proofing article comprising an antihalation effective amount of at least one antihalation dye of the general formula:

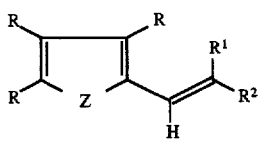

wherein: Z is an oxygen atom, NH, or NR; R is an alkyl group of 1 to 12 carbon atoms or a hydrogen atom; $R^1$ represents a perfluoroalkylsulfonyl group of 1 to 12 carbon atoms; and $R^2$ represents a perfluoroalkylsulfonyl group of 1 to 12 carbon atom, an arylsulfonyl group, or a cyano group; said at least one antihalation dye being present in or between at least one of said photosensitive color layer and said suitable support.

3. The article according to claim 2 wherein $R^1$ represents trifluoromethylsulfonyl and $R^2$ represents cyano.

4. The article according to claims 2 or 1 wherein Z is an oxygen atom.

5. The article according to claims 2 or 1 wherein Z represents NH.

6. The article according to claims 2 or 1 further comprising a thermal adhesive layer between said photosensitive color layer and said suitable support.

7. The article according to claim 6 wherein said antihalation dye is present in said thermal adhesive layer.

8. The article according to claims 2 or 1 wherein said antihalation dye is present in said suitable support.

9. A photosensitive color proofing article comprising, in order:

(a) a carrier layer;

(b) a release layer which also acts as an oxygen barrier layer;

(c) a photosensitive color layer;

(d) a photopolymerizablebarrier layer;

(e) a thermal adhesive layer; and (f) a suitable support;

said photosensitive color proofing article comprising an antihalation effective amount of at least one antihalation dye of the formula:

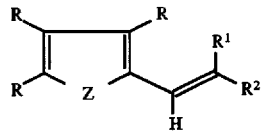

wherein: Z is an oxygen atom, NH, or NR; R is an alkyl group of 1 to 12 carbon atoms or a hydrogen atom; $R^1$ represents an arylsulfonyl group; and $R^2$ represents a perfluoroalkylsulfonyl group of 1 to 12 carbon atom; said at least one antihalation dye being present in or between at least one of said photosensitive color layer and said suitable support.

10. A photosensitive color proofing article comprising, in order:

(a) a carrier layer;

(b) a release layer which also acts as an oxygen barrier layer;

(c) a photosensitive color layer;

(d) a photopolymerizable barrier layer;

(e) a thermal adhesive layer; and (f) a suitable support;

said photosensitive color proofing article comprising an antihalation effective amount of at least one antihalation dye of the formula:

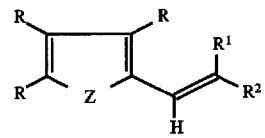

wherein: Z is an oxygen atom, NH, or NR; R is an alkyl group of 1 to 12 carbon atoms or a hydrogen atom; $R^1$ represents a perfluoroalkylsulfonyl group of 1 to 12 carbon atoms; and $R^2$ represents a perfluoroalkylsulfonyl group of 1 to 12 carbon atom, an arylsulfonyl group, or a cyano group; said at least one antihalation dye being present in or between at least one of said photosensitive color layer and said suitable support.

11. The article according to claim 10 wherein $R^1$ represents trifluoromethylsulfonyl and $R^2$ represents cyano.

12. The article according to claims 10 or 9 wherein Z is an oxygen atom.

13. The article according to claims 10 or 9 wherein Z represents NH.

14. The article according to claims 10 or 9 wherein said antihalation dye is present in said thermal adhesive layer.

15. The article according to claims 10 or 9 wherein said antihalation dye is present in said suitable support.

* * * * *